US 8,686,779 B2

(12) United States Patent
Jeurissen et al.

(10) Patent No.: US 8,686,779 B2
(45) Date of Patent: Apr. 1, 2014

(54) CALIBRATION OF LINEAR TIME-INVARIANT SYSTEM'S STEP RESPONSE

(75) Inventors: Dennis Jeurissen, Graz (AT); Gerben Willem De Jong, Veldhoven (NL); Jan Van Sinderen, Liempde (NL)

(73) Assignee: NXP, B.V., Eindhoven (NL)

( * ) Notice: Subject to any disclaimer, the term of this patent is extended or adjusted under 35 U.S.C. 154(b) by 241 days.

(21) Appl. No.: 12/989,909

(22) PCT Filed: Apr. 30, 2009

(86) PCT No.: PCT/IB2009/051762
§ 371 (c)(1),
(2), (4) Date: Oct. 27, 2010

(87) PCT Pub. No.: WO2009/136329
PCT Pub. Date: Nov. 12, 2009

(65) Prior Publication Data
US 2011/0043267 A1    Feb. 24, 2011

(30) Foreign Application Priority Data
May 6, 2008    (EP) .................................... 08103829

(51) Int. Cl.
*H03L 5/00*    (2006.01)
(52) U.S. Cl.
USPC ...................................... 327/306; 324/762.01
(58) Field of Classification Search
USPC ...................................... 327/306; 324/762.01
See application file for complete search history.

(56) References Cited

U.S. PATENT DOCUMENTS

| 3,286,180 | A | 11/1966 | Hubbs |
| 5,243,343 | A * | 9/1993 | Moriyasu ..................... 341/123 |
| 5,473,946 | A | 12/1995 | Wyse et al. |
| 6,232,834 | B1 | 5/2001 | Zheng |
| 2005/0253651 | A1 | 11/2005 | Quek |
| 2006/0047491 | A1 | 3/2006 | Li et al. |

FOREIGN PATENT DOCUMENTS

| DE | 10 2005 029615 A1 | 1/2007 |
| GB | 2 149 988 A | 6/1985 |
| GB | 2 217 942 A | 11/1989 |
| JP | 08-149381 A | 6/1996 |
| KR | 10 2004 0076935 | 9/2004 |

OTHER PUBLICATIONS

International Search Report and Written Opinion for Int'l. Patent Application No. PCT/IB2009/051762 (Oct. 6, 2009).

* cited by examiner

*Primary Examiner* — Kenneth B. Wells

(57) ABSTRACT

The invention concerns in general measurement of the transfer function of linear time invariant systems, more particular the calibration of such systems based on a measured transfer function. According to a first aspect the present invention an arrangement for measuring the transfer function of a linear time-invariant system is disclosed. According to a second aspect of the present invention the arrangement is implemented into a linear time-invariant circuitry having a transfer function representing the amplitude and phase characteristic of the circuitry, where by means of the arrangement for measuring the transfer function the transfer function can be optimized in accordance with certain criteria on-the-fly, i.e. in or before operation of the circuit. Finally, an effective and simple method for measuring of the transfer function of a linear time-invariant system together with the use or application of the method is shown.

9 Claims, 7 Drawing Sheets

BACKGROUND

BACKGROUND

CALIBRATION OF LINEAR TIME-INVARIANT SYSTEM'S STEP RESPONSE

FIELD

The present invention relates, in general, to the measurement of the transfer function of linear time invariant systems and weakly non-linear time invariant systems. In particular, the present invention relates to the calibration of such systems based on a measured transfer function thereof.

According to a first aspect, the present invention relates to an arrangement for measuring the transfer function of a linear time-invariant system. According to a second aspect, the present invention relates to linear time-invariant circuitry having a transfer function representing the amplitude and phase characteristics of the circuitry, in which the arrangement for measuring the transfer function can be implemented. Yet another aspect of the invention relates to a method for measuring the transfer function of a linear time-invariant system. A last aspect of the invention concerns the use or application of the method.

BACKGROUND

Stability of linear time-invariant systems, such as low noise amplifiers (LNAs) or intermediate frequency amplifiers (IF-AMPS), just to name two examples, can be a serious issue when large linearity is required and, therefore, both loop gain and bandwidth are high. The reason for this is that high linearity and large bandwidth normally only can be achieved by very high loop gain in combination with feedback. In order to achieve a large loop gain, in most applications, a large, uneven number of inverting stages are used to get negative feedback. However, stability problems occur when the phase of the loop-transfer function, in combination with unity loop-gain, becomes 180°.

FIG. 1 shows a simplified schematic of a feedback amplifier 100. The function for the closed-loop gain $A_{cl}$ of this amplifier can be defined by the following Equation 1.

$$\text{Out/In} = A_{cl} = d*A/1 + A*k, \quad \text{(Equation 1)}$$

where the closed-loop gain $A_{cl}$ approaches infinity when the (open) loop-gain $A_k$, becomes −1, i.e., when the phase of the loop-gain $A_k$ is 180° at unity loop-gain. Therefore, traditional amplifiers are designed with a certain phase margin, which is the margin of the phase that is left at unity gain. There are several ways to design an amplifier with sufficient phase margin. In pole splitting, for example, the intrinsic phase transfer is modified in such a way that at unity gain the phase has enough margin with respect to the aforementioned 180°.

FIG. 2 shows an example of modification of the transfer function represented the amplitude characteristics $|A|=|V_{out}/I_{in}|$ and phase characteristics $\phi=\arctan(V_{out}/I_{in})$, by adding pole-split components; in FIG. 2, a series circuit of a resistor R and a capacitor C are depicted as an example for pole-splitting components, which define the feedback function or factor k. However supply, process, and temperature variations often result in a different transfer function of the amplifier. A compensated amplifier not operating under nominal operating conditions always introduces a tradeoff with respect to linearity and bandwidth.

U.S. Pat. No. 6,232,834 discloses calibration of an integrated operational amplifier for optimization of the phase margin. The calibration is done to correct changes caused by operating temperature and supply voltages as well as process variations and aging that can affect the stability of the amplifier. A calibration circuit measures the response of the operational amplifier to a pulse input and controls a feedback impedance to produce an optimized phase margin. The output response to the pulse input is measured at two different times, at a first time close to the transition, capturing the peak overshoot from an underdamped amplifier and, at a second time, later than the first measurement when the distortions from the underdamped ringing have diminished. A quantizer circuit compares the two measured voltages and provides an input to control logic, which selects the amount of reactance in the feedback of the operational amplifier. The calibration terminates when the dampening of the amplifier has reached the least significant bit of adjustment available to the calibration process. However, U.S. Pat. No. 6,232,834 does not provide how the response of circuits operated at high frequencies can be measured.

At this moment, very robust design methods are used in order to make sure that radio frequency (RF) circuits perform under all conditions. This means that often circuits don't perform optimally because possible mismatches dictate less than optimal bias conditions. Accordingly, designing an amplifier in a traditional way often means that one needs to take into account numerous possibilities in which the circuit might be situated. For stability, a rule of thumb is a phase margin of 60° in nominal condition. Overall, this will lead to an amplifier that will be stable during worst-case situations.

SUMMARY

Accordingly, it is an object of the present invention to provide a method and an implementation which enables calibration of linear time-invariant systems, e.g., a feedback amplifier with potential risk of instability.

It is a further object to enable the calibration "on-the-fly", i.e., in case of an integrated circuit on chip in operation thereof. In particular, it is still a further object to ensure the cost with respect to power dissipation or area does not negatively influence the system.

At least one of the objects is achieved by an arrangement for measuring the transfer function of a substantially linear time-invariant system.

Accordingly, the arrangement comprises a test signal generator connected to an input of the system and configured to input a test signal for exciting of the system, a buffer for storing an instantaneous sample of a response signal at an output of the system, a trigger unit for triggering the buffer to store and to provided at an output of the buffer, in response to the test signal at least one respective instantaneous value of the response signal, wherein the arrangement is further configured to generate a sequence of samples of discrete values of the response signal by iteratively exciting the system with the test signal, with an iterative adjusted predetermined delayed action of the trigger unit, until enough samples have been taken, from which the transfer function can be derived.

In a particular embodiment, the at least substantially linear time-invariant system comprises an electronic circuit, such as an amplifier circuit. More particularly, the amplifier circuit comprises a group with at least one amplification stage, i.e., at least one or more amplification circuits forming an amplification stage. In other words, the amplifier circuit may be a chain of several amplifier stages. Further, the amplification circuit comprises at least one feedback path from an output of one amplification stage of the group back to an input of one amplification stage of the group. Accordingly, the amplifier circuit may comprise a global feedback path from the output of the amplifier circuit back to its input, but also any other possible feedback path from any available output of one of the amplifier circuits back to the input of any preceding amplifier circuit.

The trigger unit may comprise a delay unit which is connected to the test signal generator. Thus, the trigger unit can be configured to receive and delay the test signal by an adjustable delay, and to supply the delayed test signal to the buffer. Then, the buffer can be configured such that the delayed test signal triggers the buffer to store the respective instantaneous value of the response signal and to provide the sample at an output of the buffer.

In certain embodiments, the buffer may comprise a buffer circuit. The buffer circuit can have a track and hold circuit connected to the output of the system. Then, the track and hold circuit can be configured such that the hold function is controlled by means of the delayed test signal to hold (or store) the instantaneous value of the response signal. The held or stored instantaneous value can be provided at the output of the track and hold circuit.

In certain embodiments, the delay unit can be implemented as a delay circuit comprising a plurality of different delay elements that are configured to be selective by means of a selection unit so that the delay elements can be selectively applied to the test signal.

The test signal is preferably a step function. In this case, the test signal generator may preferably comprise a Square Wave Generator (SWSG).

Further, at least one of the objects is further solved by a linear time-invariant circuit having a transfer function representing the amplitude and phase characteristic of the circuit, which implements an embodiment of the afore-discussed arrangements.

Accordingly, the circuitry comprises at least one feedback path between an output and an input of the circuitry, a selectively adjustable feedback circuit within the feedback path, wherein the circuit arrangement is configured to measure the transfer function of the circuitry and to modify the transfer function by adjusting the feedback circuit based on the measured transfer function with respect to a stability criterion. It is worth noting that the circuit may consist of several functional stages, where there may be at least one local feedback path of an intermediate stage; that is, in cases where the circuit consists of more than one and an uneven amount of stages.

In one embodiment, the linear time-invariant circuitry is an amplifier circuit in a feedback configuration. As discussed above in connection with the measuring arrangement, the amplifier circuit may comprise a group with one or more amplification stages, i.e., the amplifier circuit may comprise a chain of several amplifier stages, and at least one feedback path from an output of one amplification stage of the group back to an input of one amplification stage of the group. The feedback circuit may comprise a pole-splitting circuit having switchable circuit elements, such as capacitors, inductors, and resistors. The stability criterion can be a phase margin at the frequency where a loop-gain becomes 1, i.e. 0 dB.

By measuring the response to a small step-shaped test signal as a function of time at the input of such a system, the internal stabilizing components can be adapted in order to create more phase margin if needed.

Furthermore, at least one of the objects is achieved by a method for measuring of a transfer function of a substantially linear time-invariant system.

Accordingly, the method comprises: a) exciting the system by a test signal at an input thereof; b) measuring after a predetermined delay time the instantaneous value of the response signal at an output of the system; c) increasing the predetermined delay time by a predetermined duration; d) repeating the steps a) to c) until enough samples from the response signal have been taken, from which the transfer function can be derived.

In certain embodiments, the measuring step may comprise tracking the response signal of the system until the predetermined delay time has elapsed and then holding the instantaneous value of the response signal.

The method may further comprise converting the measured instantaneous values of the response signal into digital data and storing the digital data in a memory.

In a further development, the measuring step can further be improved by measuring multiple samples of the response signal with the same delay time and generating one representative sample for each delay time by predetermined processing, such as, for example, averaging.

Finally, the method may be used for evaluating at least substantially linear time-invariant system with respect to a stability criterion. If the time-invariant system is an electronic circuit, the transfer function thereof can be modified based on the evaluated stability criterion or any other suitable criterion.

The basic idea of the invention enables measuring of the step response of a system, which can be considered as a substantially non-linear time invariant system, e.g., any amplifier circuit in some feedback configuration, and then to take measurements for adjustment of the transfer function accordingly. Especially radio frequency (RF) circuits that operate at large, i.e., high, frequencies can be measured and calibrated with relative low frequency operating circuits, and thus low power, using this method. Accordingly, a method, as well as an implementation, is described to calibrate linear time-invariant systems such as feedback amplifiers with potential risk of instability.

In this connection, it may be worth noting that the herein proposed concept can be used in any system, of which the transfer function is to be measured, being substantially linear and time invariant, i.e., the system may be weakly non-linear or nearly linear, respectively. For example, in principle almost all amplifier circuits, as one possible embodiment of such a system, are weakly non linear, but, usually by means of the feedback configuration, the system is linearized.

By measuring the response to a small step-shaped signal as a function of time at the input of a linear time-invariant system, internal stabilizing components can be adapted "on-the-fly" in order to create more phase margin, if needed. In other words, an optimization of the design of an amplifier for each situation, supply, process, and temperature condition is possible.

For instance, the circuit can be provided with a set of compensation component values for each specific situation. Compensation by using pole splitting is preferable because only resistor and capacitor banks are required that can be switched accordingly. This results in an easy implementation and can be determined by design. However, design of the amplifier has been more difficult in previous solutions and is now possible by way of the present invention.

Preferred embodiments and further developments of the invention are defined in the claims. It shall be understood that the apparatus and the method of the invention have similar and/or identical preferred embodiments and advantages.

BRIEF DESCRIPTION OF THE DRAWINGS

These and other aspects of the invention will be apparent from and elucidated with reference to the embodiment(s) described hereinafter. In the following drawings, the Figures are schematically drawn and not true to scale, and identical reference numerals in different Figures, if any, may refer to corresponding elements. It will be clear for those skilled in the art that alternative but equivalent embodiments of the invention are possible without deviating from the true inventive concept, and that the scope of the invention is limited by the claims only.

DETAILED DESCRIPTION

In general, a linear time-invariant system can be characterized by its differential equation, for example in the form of the following Equation 2.

$$a\,d^2y/dt^2 + b^*dy/dt + cy = e^*du/dt + f \qquad \text{(Equation 2)}$$

The differential equation of Equation 2 can be rewritten into the Laplace-domain transfer function, which describes the pole locations and zero locations of the system.

$$H(s) = e^*s + f/a^*s^2 + b^*s + c \qquad \text{(Equation 3)}$$

The poles and zeroes can be used to determine the stability of the system. The relation between the poles and zeroes of the transfer function and the behavior of system can be shown in the s-plane.

Figure 3:
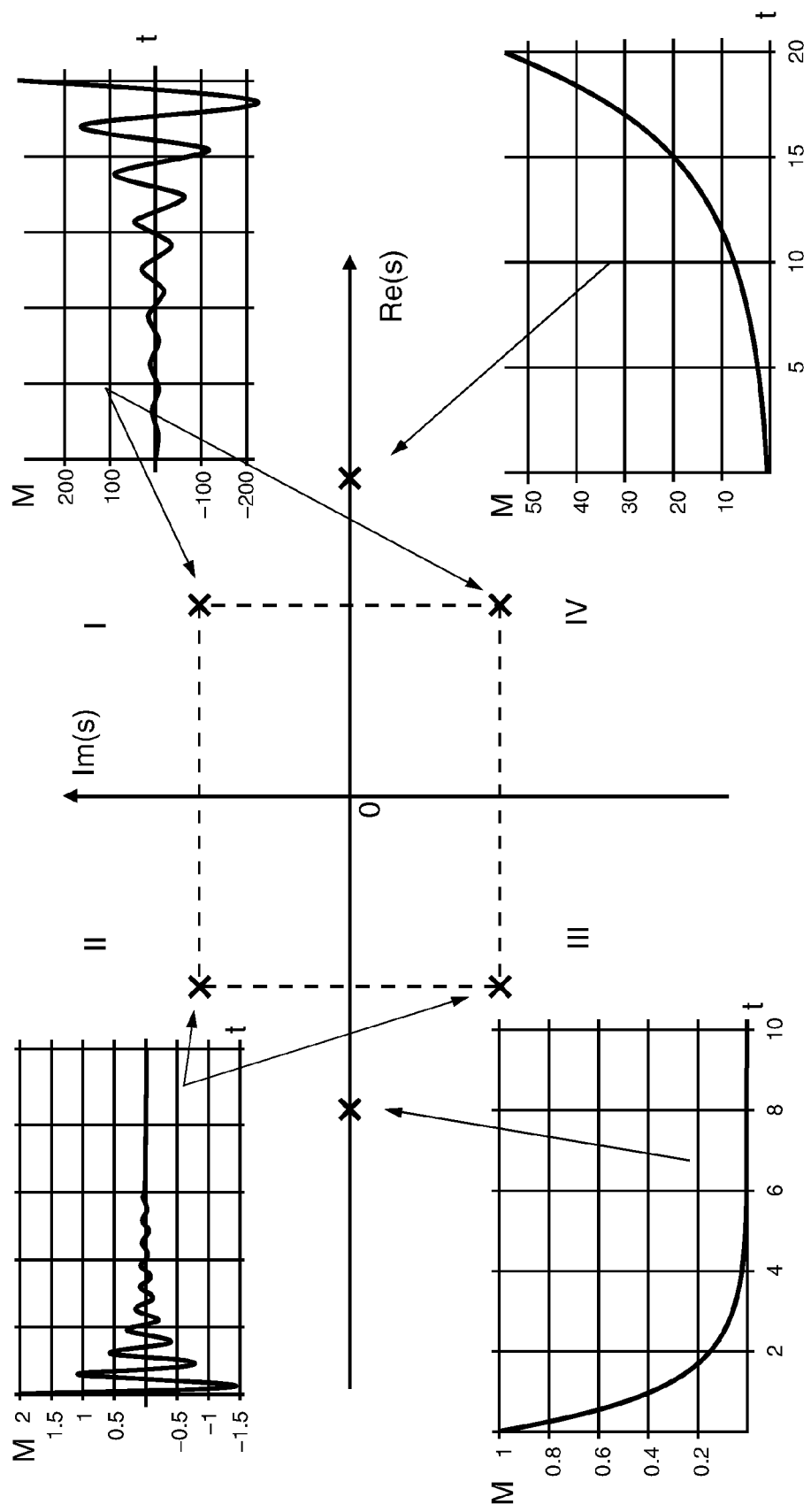
FIG. 3 illustrates the influence of the pole and zero position of a system on its time-domain impulse response.

FIG. 3 illustrates the influence of the pole and zero positions of a system in response to a time-domain impulse. By application of a step signal at the input of the device under test (DUT), the response can be measured. Then, changing respective pole-splitting elements, e.g., the capacitor and resistor banks, will result in different responses. As soon as the desired response is detected, the DUT is optimized within that specific situation. However, to measure the response of the DUT for high operation frequency, calibration should be "on-the-fly", i.e., in operation of the respective circuit.

Figure 1:
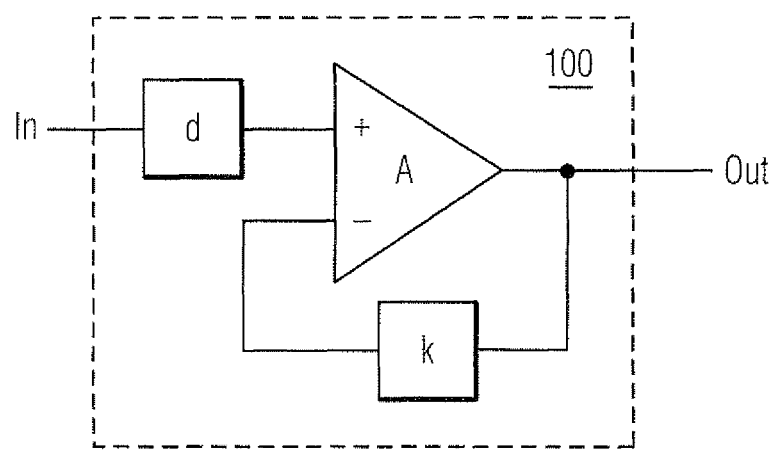
FIG. 1 shows a simplified schematic of a feedback amplifier as a simple example for a linear time invariant system.
Figure 2:
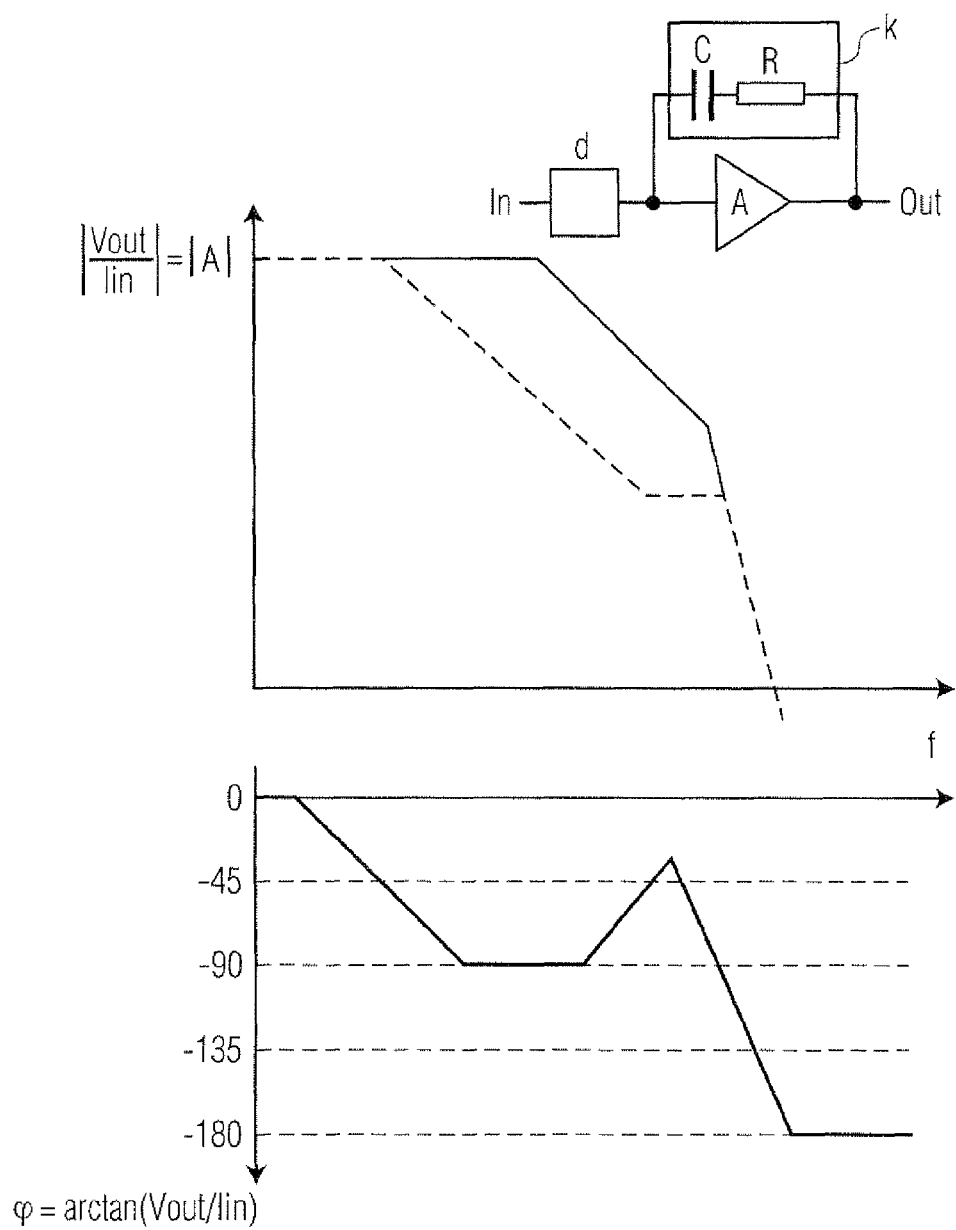
FIG. 2 illustrates the effect of pole-splitting to increase the phase margin at unity gain.
Figure 4:
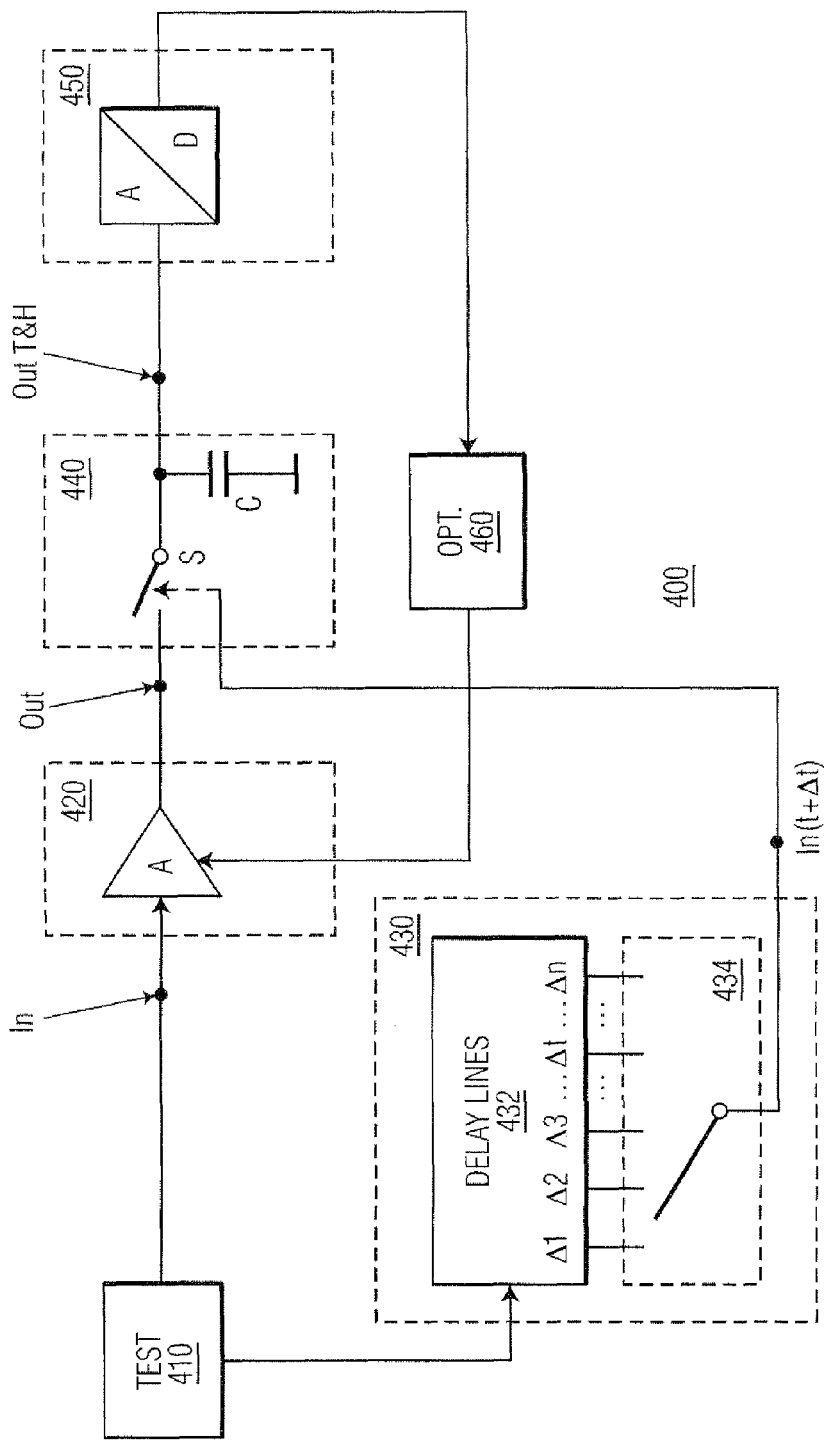
FIG. 4 shows an AC calibration circuit arrangement for a fast step response of a linear time-invariant system according to a first embodiment of the invention.

FIG. 4 shows a calibration circuit arrangement 400 for a fast step response of a linear time-invariant system according to a first embodiment of the invention. Test signal means 410 for generating a step signal as a test signal are provided, for which, e.g., a Square Wave Signal Generator (SWSG) can be used. The output of the test signal means 410 is connected to the input (In) of a device under test (DUT) 420, which can be an amplifier circuit arrangement as illustrated in FIG. 1. Accordingly, the DUT 420 is excited by the test signal from the SWSG 410.

Further, the output of the test signal means 410 is connected to delay means 430, where the test signal is used to trigger or switch respective delay elements, e.g., delay lines. Thus, the actual test signal is provided at the output of delay means 430 with a respective delay. The delay means 430 can be implemented by a bank of delay lines 432, where a particular output is selected by means of a multiplexer 434. It goes without saying that the selectable and predetermined delay for the test signal can be provided in numerous equivalent ways, which are well known to the person skilled in the art.

Figure 5:
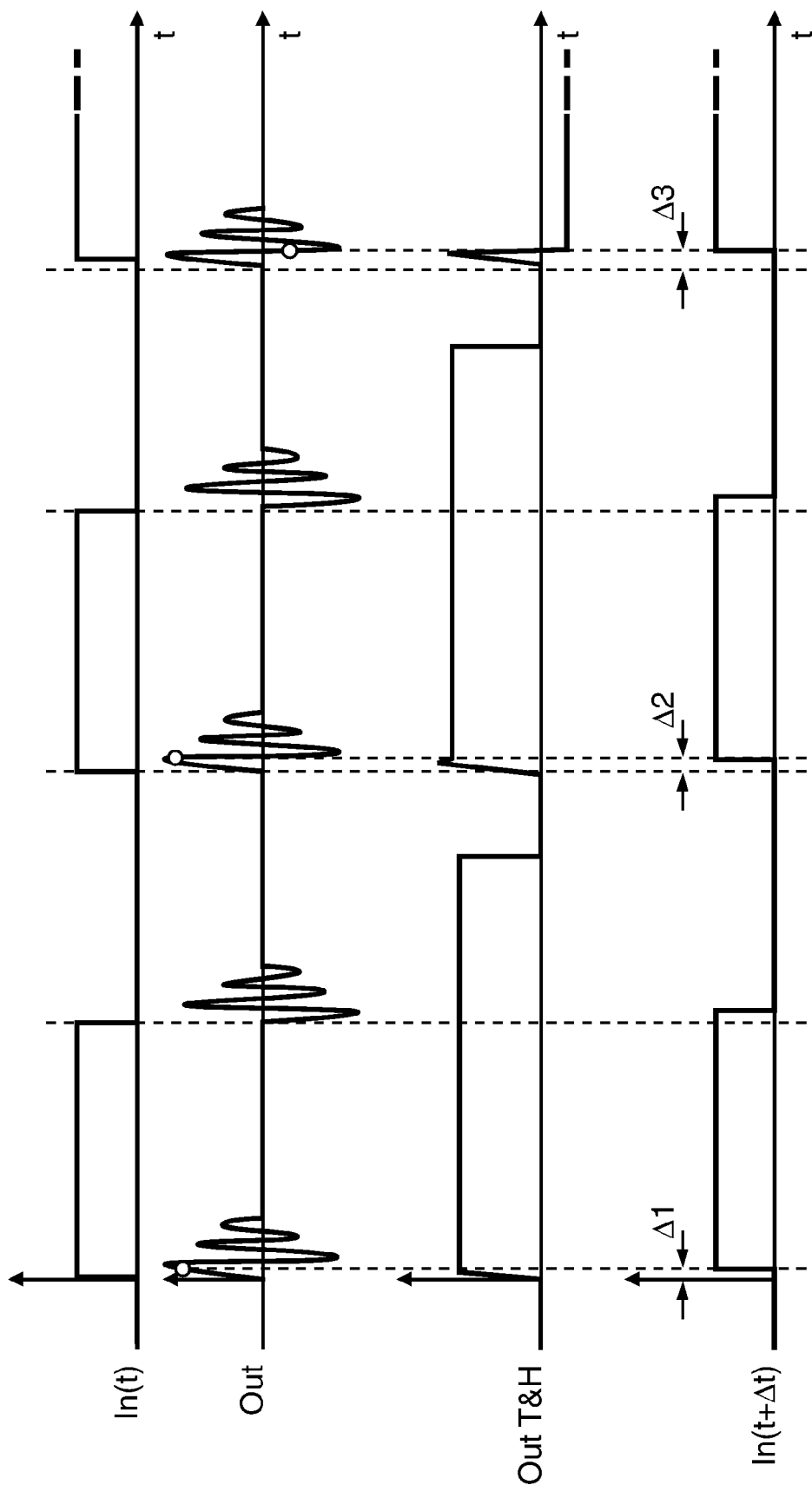
FIG. 5 illustrates tracking and holding of the response signal in the circuit of FIG. 4.

The output (Out) of the DUT 420 is connected to a track-and-hold (T&H) circuit 440, which is depicted in a simplified manner by a switch S and a capacitor C. The functionalities of the T&H circuit 440 are triggered or switched by means of the delayed test signal provided from the delay means 430. The circuit implementation and operation of the T&H circuit 440 is not described here in more detail, since it is a well-known basic circuit function, which should be well known for the skilled person. The output of the T&H circuit 440 is supplied to an Analog-to-Digital (A/D) Converter (ADC) 450, the output of which is input to optimization logic 460, which can be implemented as a microprocessor, digital signal processor (DSP), or application-specific integrated circuit (ASIC). The optimization logic 460 collects the sequence of generated outputs from the T&H circuit 440 (at point Out T&H) and derives or constructs from the sequence of measurement data the step response of the DUT 420. The corresponding signals at points In, Out, and Out T&H are described in FIG. 5.

As discussed above, the measurement of the step response signal of the DUT 420 can be a very demanding task, since the step response can be comprised of very high frequency components. In order to relax the mixed-signal and digital circuitry, like the ADC 450 and optimization logic 460, the present invention proposes to use several successive step responses to determine the entire response of the DUT 420.

Accordingly, the basic idea of the invention is to use several predetermined delays $\Delta 1, \Delta 2, \Delta 3, \ldots, \Delta t, \ldots, \Delta n$ provided by the delay means 430. The respective delays $\Delta 1, \Delta 2, \Delta 3, \ldots, \Delta t, \ldots, \Delta n$ are accurately determined and selectable by means of a selection unit 434, which may be implemented by a multiplexer, such that a certain part, i.e., a certain discrete value at a predetermined point in time, of the (step) response signal can be windowed or captured. This way, it is possible to measure and digitize the step response containing or being comprised of high frequency signals by means of low frequency clocking digital circuitry.

When the DUT 420 is excited by the input test signal, the switch S is closed. Thus, the tracking function of the T&H circuit 440 tracks the response. After a delay of $\Delta 1$, when the switch S is opened, the hold function of the T&H circuit 440, depicted by the capacitor C, has stored the last value just before opening of the switch S of the response signal of the DUT 420. Next, the ADC 450 stores the hold value in a memory of the optimization logic 460, e.g., a DSP. The next time the DUT 420 is excited by a rising step of the test signal provided by the test signal means 410, the switch is again already turned on, but this happens a little bit later ($\Delta 1 < \Delta 2$) compared to the previous measurement cycle, and the tracking and hold function of the T&H circuit 440 again follows the response signal of the DUT 420 until the switch S is turned off. The ADC 450 then again stores the held value in the memory of the optimization logic 460 and so on.

As soon as enough samples have been taken, the optimization logic 460, e.g., a DSP or ASIC, is configured to determine if the DUT 420 requires modification with respect to stability. In order to have a more accurate result, it may be beneficial to measure multiple samples with the same delay and then to use some averaging.

It goes without saying that the test signal does not need to be a step signal any other suitable test signal, which can be reproduced with the required accuracy, may be used. However, having a step signal as the test signal for exciting the DUT is preferred.

Figure 6:
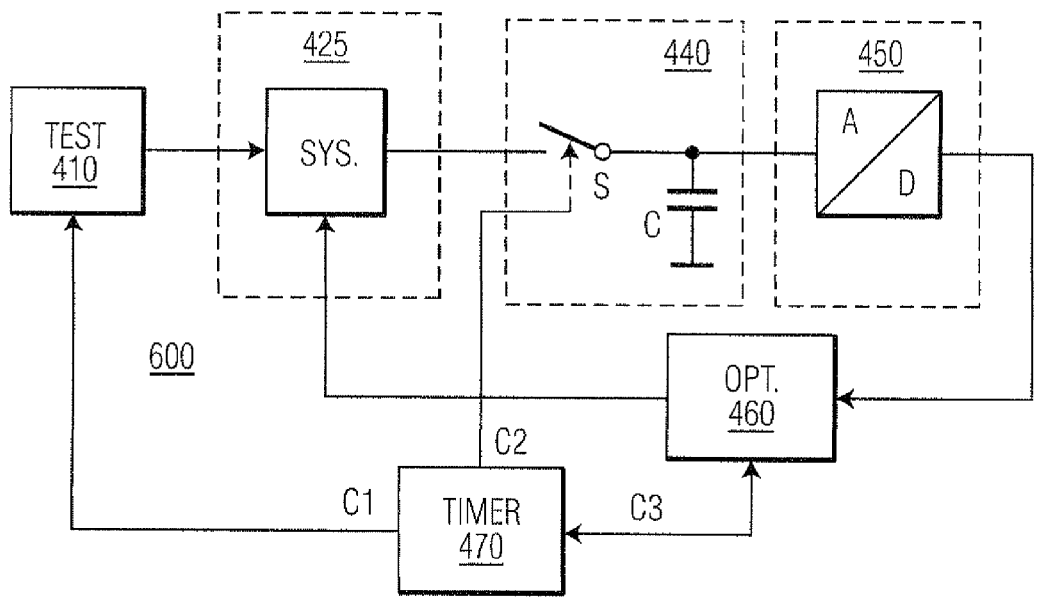
FIG. 6 shows a calibration circuit arrangement for a slow step response of a linear time-invariant system according to a second embodiment of the invention.

The inventors found that the previously described concept holds for every linear time-invariant system. Also, slow responding systems can be calibrated, where the delay means 430 are not needed. An arrangement applicable for calibration of a slow system is shown in FIG. 6, which shows a calibration circuit arrangement 600 for measuring a slow step response of a linear time-invariant system 425 according to a second embodiment of the invention. Such a slow system 425 can be, e.g., an intermediate frequency (IF) filter. However, it will be appreciated that the proposed solution may also be applicable in complex technical systems such as a beer-brewery system or a petrochemical system. Accordingly, applications for calibration of linear time-invariant systems include amplifiers and filters in electronic circuits, but also process-control applications that are widely used in, e.g., the petrochemical industry, the food industry and, the robot industry.

In FIG. 6, the linear time invariant system 425 is excited by a test signal, e.g., a step signal or ramp signal, just to name two examples, from the test signal generator 410. As described in connection with the arrangement of FIG. 4, a buffer 440, which suitably implements the required track and hold (T&H) or sample and hold (S&H) functionality, catches or windows discrete values of the system's response signal at predetermined instances of time. Unlike FIG. 4, in FIG. 6 a timer unit 470 is used, which, on the one hand, controls or triggers the generation of the test signal via line C1 and, on the other hand, via control line C2 triggers or controls the T&H or S&H function of the buffer 440. The transfer function of the system 425 is derived from a suitable number of discrete instantaneous values of the response signal by a respective configured optimization unit 460, which in the case of a slow system may be implemented in software on a respective computer system, e.g., a personal computer. It will be appreciated that the timer unit 470 may be connected and controlled via control line C3 by the optimization logic 460 or may even be a part thereof.

However, a person skilled in the art will appreciate that the herein described embodiments serve as simplified examples for illustration of the basic idea or principle of the invention and it is not intended to restrict the present invention thereby or thereon.

Figure 7:
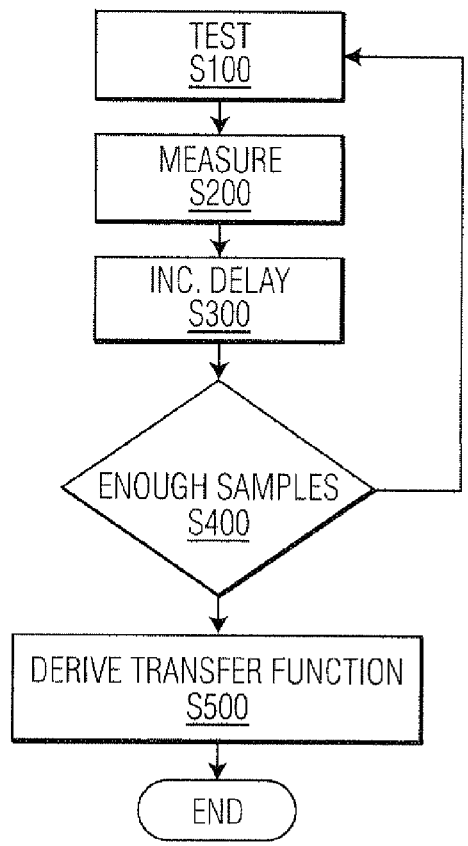
FIG. 7 shows a flow chart depicting steps of the method according to the present invention.

FIG. 7 shows a flow chart depicting steps of the method for measuring a transfer function of a linear time-invariant system according to the present invention.

Accordingly, at step S100 the linear time-invariant system is excited by a test signal at an input of the system. Then, at step S200, after a predetermined delay time, an instantaneous value of the response signal at an output of the linear time-invariant system is measured.

Next, at step S300 the predetermined delay time is increased by a predetermined (time) duration. In step S400, it is checked whether enough samples from the response signal have been taken in order to be able to derive the transfer function from the sequence of samples. If further samples are required, steps S100 to S300 are repeated by returning from step S400 to step S100. Otherwise, the method proceeds to step S500, where the transfer function is derived from the sequence of samples of the transfer function. Based on the knowledge of the transfer function, any applicable modification or change in the system may be performed. Alternatively, the method may simply be used to find the characteristics of the system which can be defined by means of the transfer function.

The measuring step S200 can be performed by tracking the response signal of the linear time-invariant system until the predetermined delay time has elapsed and then holding the instantaneous value of the response signal.

Further, the measuring step S200 can further comprise converting of the measured instantaneous values of the response signal into digital data and storing the digital data in a memory for further processing.

Furthermore, the measuring step S200 may further comprise measuring multiple samples of the response signal with the same delay time and generating one representative sample for each delay time by predetermined processing, such as averaging.

Figure 8:
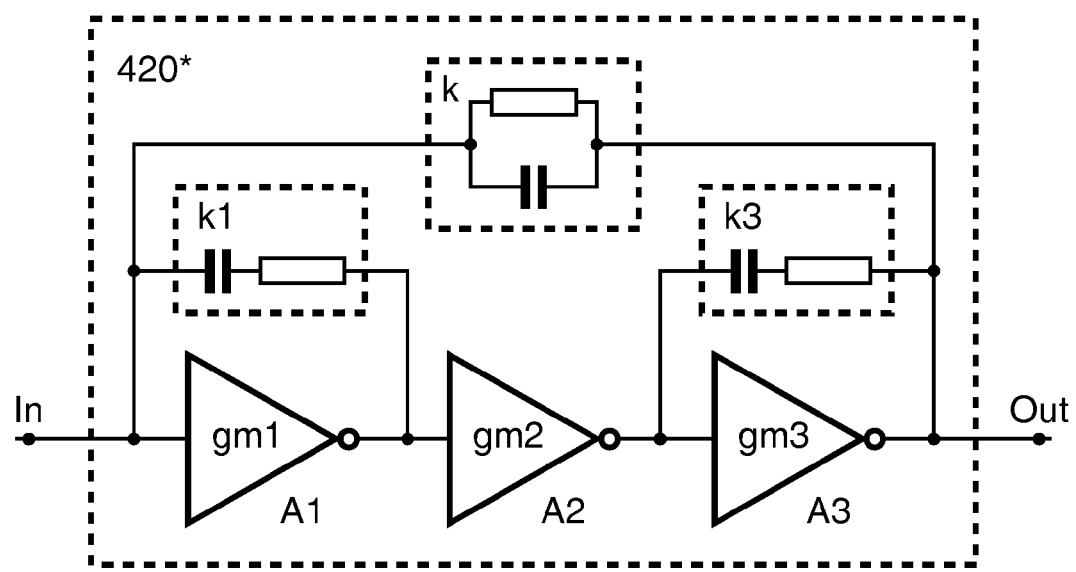
FIG. 8 illustrates a multi-stage amplifier circuit as a more complex example for a linear time invariant system, where the present invention can be applied.

Now, with respect to FIG. 8, a more complex circuit appears as an example for a linear time invariant system, of which the transfer function can be measured by means of the present invention. The system is a circuit which comprises a multi-stage amplifier 800 setup by three amplification stages A1, A2, and A3 with two intermediate feedback k1, k2 and one overall feedback k. Accordingly, the overall transfer function of the multi-stage amplifier 800 can be determined by the method or arrangement of the present invention and if the respective feedback networks with its respective feedback factor k1, k2, and k as well as the amplification factors gm1, gm2, and gm3 of the amplification stages A1, A2, and A3 are made adjustable the transfer function may be adjusted or modified "on-the-fly". Of course, it goes without saying that a skilled person will recognize that any other possible linear time invariant circuitry, or at least weakly non-linear time invariant system, with adjustable elements will be a potential candidate for the method and arrangement of the present invention.

Finally, as discussed above, the method can be used for evaluating the linear time-invariant system with respect to a stability criterion. For example, if the time-invariant system is an electronic circuit, the transfer function thereof can be modified based on an evaluated criterion, such as the herein discussed stability criterion.

It goes without saying that persons skilled in the art understand that any modification of the system is possible, the effect of which can be evaluated by means of the measured transfer function as proposed herein.

Summarizing, the invention has disclosed, in general, a method for measurement of the transfer function of linear time invariant systems and, more particularly, an approach for the calibration of such systems based on a measured transfer function. According to a first aspect of the present invention, an arrangement for measuring the transfer function of a linear time-invariant system has been disclosed. According to a second aspect of the present invention, the arrangement has been shown implemented into linear time-invariant circuitry having a transfer function representing the amplitude and phase characteristics of the circuitry, where, by means of the arrangement for measuring the transfer function, the transfer function can be optimized in accordance with certain criteria on-the-fly, i.e., in or before operation of the circuit.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single means or other unit may fulfill the functions of several items recited in the claims. The mere fact that certain measures are recited in mutually different dependent claims does not indicate that a combination of these measured cannot be used to advantage. Any reference signs in the claims should not be construed as limiting the scope.

The invention claimed is:

1. An arrangement configured to measure a transfer function of a linear time-invariant system, the arrangement comprising:
   a test signal generator connected to an input of the system and configured to input a test signal for exciting of the linear time-invariant system;
   a buffer configured to store an instantaneous sample of a response signal at an output of the system; and
   a trigger unit configured to trigger the buffer to store and provide at an output of the buffer, in response to the test signal, at least one respective instantaneous value of the response signal, wherein the arrangement is further configured to generate a sequence of samples of discrete values of the response signal by iteratively exciting, at predetermined instances of time increasing by a predetermined duration, the linear time-invariant system with the test signal until enough samples have been taken to derive the transfer function and the trigger unit comprises:
   a delay unit, connected to the test signal generator, and configured to receive and delay the test signal by an adjustable delay, and supply the delayed test signal to the buffer, wherein the buffer is further configured such that the delayed test signal triggers the buffer to store the at least one respective instantaneous value of the response signal and provide the sample at an output of the buffer.

2. The arrangement according to claim 1, wherein the linear time-invariant system comprises:
   an amplifier circuit further comprising:
      at least one amplification stage, and
      at least one feedback path.

3. The arrangement according to claim 1, wherein the delay unit is a delay circuit comprising a plurality of different delay elements configured to be selected by a selection unit and the delay elements are configured to be selectively applied to the test signal.

4. The arrangement according to claim 1, wherein the test signal comprises a step function and the test signal generator comprises a Square Wave Generator.

5. Linear time-invariant circuitry having a transfer function representing an amplitude and a phase characteristic of the linear time-invariant circuitry, the linear time-invariant circuitry comprising:
   at least one feedback path between an output and an input of the linear time-invariant circuitry;
   a selectively adjustable feedback circuit within the feedback path; and
   a circuit arrangement according to claim 1, wherein the circuit arrangement is configured to measure the transfer function of the linear time-invariant circuitry and to modify the transfer function by adjusting the feedback circuit based on the measured transfer function with respect to a stability criterion.

6. The linear time-invariant circuitry according to claim 5, wherein the feedback circuit is a pole-splitting circuit comprising switchable circuit elements.

7. The linear time-invariant circuitry according to claim 5, wherein the stability criterion is a phase margin at a frequency where a loop-gain becomes 1 or 0 dB.

8. The linear time-invariant circuitry according to claim 5, wherein the linear time-invariant circuitry is an amplifier circuit in a feedback configuration, which amplifier circuit comprises at least one amplification stage and at least one feedback path.

9. An arrangement configured to measure a transfer function of a linear time-invariant system, the arrangement comprising:
   a test signal generator connected to an input of the system and configured to input a test signal for exciting of the linear time-invariant system;
   a buffer configured to store an instantaneous sample of a response signal at an output of the system, wherein the buffer comprises: a buffer circuit comprising a track and hold circuit connected to the output of the linear time-invariant system, the track and hold circuit being configured such that the hold function is controlled by the delayed test signal and the instantaneous value of the response signal is held and provided at the output of the track and hold circuit; and
   a trigger unit configured to trigger the buffer to store and provide at an output of the buffer, in response to the test signal, at least one respective instantaneous value of the response signal, wherein the arrangement is further configured to generate a sequence of samples of discrete values of the response signal by iteratively exciting, at predetermined instances of time increasing by a predetermined duration, the linear time-invariant system with the test signal until enough samples have been taken to derive the transfer function.

* * * * *